United States Patent
Ayranci et al.

(10) Patent No.: US 12,184,248 B2
(45) Date of Patent: *Dec. 31, 2024

(54) RFFE LNA TOPOLOGY SUPPORTING BOTH NONCONTIGUOUS INTRABAND CARRIER AGGREGATION AND INTERBAND CARRIER AGGREGATION

(71) Applicant: pSemi Corporation, San Diego, CA (US)

(72) Inventors: Emre Ayranci, Costa Mesa, CA (US); Miles Sanner, San Diego, CA (US); Phanindra Yerramilli, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 268 days.

This patent is subject to a terminal disclaimer.

(21) Appl. No.: 17/741,130

(22) Filed: May 10, 2022

(65) Prior Publication Data
US 2022/0345096 A1 Oct. 27, 2022

Related U.S. Application Data

(63) Continuation of application No. 17/010,311, filed on Sep. 2, 2020, now Pat. No. 11,336,243, which is a continuation of application No. 16/279,487, filed on Feb. 19, 2019, now Pat. No. 10,771,025.

(51) Int. Cl.
| | |
|---|---|
| *H03F 1/22* | (2006.01) |
| *H03F 3/16* | (2006.01) |
| *H03F 3/30* | (2006.01) |
| *H03F 3/45* | (2006.01) |

(52) U.S. Cl.
CPC ............. *H03F 3/3089* (2013.01); *H03F 3/16* (2013.01); *H03F 3/45179* (2013.01); *H03F 2200/294* (2013.01)

(58) Field of Classification Search
CPC ......................................................... H03F 1/22
USPC ................................................. 330/311, 310
See application file for complete search history.

(56) References Cited

U.S. PATENT DOCUMENTS

| | | | | |
|---|---|---|---|---|
| 7,095,281 | B2* | 8/2006 | Zipper | ................ H03F 3/45654 330/261 |
| 8,031,005 | B2* | 10/2011 | Xiong | ....................... H03F 3/72 330/311 |
| 8,928,415 | B2 | 1/2015 | Cha et al. | |
| 10,454,426 | B2* | 10/2019 | Fikstvedt | ................ H03F 3/604 |
| 10,607,560 | B2* | 3/2020 | Tsuchi | ................. G09G 3/3614 |
| 10,686,409 | B2* | 6/2020 | Pal | .......................... H03F 1/223 |
| 10,771,025 | B1 | 9/2020 | Ayranci et al. | |
| 11,336,243 | B2 | 5/2022 | Ayranci et al. | |
| 2004/0196101 | A1 | 10/2004 | Deletraz | |
| 2004/0246056 | A1 | 12/2004 | Behzad et al. | |

(Continued)

OTHER PUBLICATIONS

Choe, Henry, Notice of Allowance received from the USPTO dated May 1, 2020 for U.S. Appl. No. 16/279,487, 7 pgs.

(Continued)

*Primary Examiner* — Henry Choe
(74) *Attorney, Agent, or Firm* — Steinfl + Bruno LLP

(57) ABSTRACT

A receiver topology for supporting various combinations of interband carrier aggregation (CA) signals, intraband noncontiguous CA and non-CA signals having different combinations of signals aggregated therein.

22 Claims, 9 Drawing Sheets

(56) References Cited

U.S. PATENT DOCUMENTS

| | | |
|---|---|---|
| 2006/0006950 A1 | 1/2006 | Burns et al. |
| 2009/0051432 A1 | 2/2009 | Sutardja |
| 2013/0316670 A1 | 11/2013 | Tasic et al. |
| 2020/0266778 A1 | 8/2020 | Ayranci et al. |
| 2021/0058044 A1 | 2/2021 | Ayranci et al. |

OTHER PUBLICATIONS

Choe, Henry, Response to Rule 312 Communication received from the USPTO dated Jun. 29, 2020 for U.S. Appl. No. 16/279,487, 3 pgs.
Psemi Corporation, Amendment After Allowance filed in the USPTO dated Jun. 19, 2020 for U.S. Appl. No. 16/279,487, 11 pgs.
Liu, et al., English translation of Office Action received from the CNIPA dated Nov. 5, 2021 for appln. No. 202010100721.5, 10 pgs.
Choe, Henry, Notice of Allowance received from the USPTO dated Feb. 9, 2022 for U.S. Appl. No. 17/010,311, 6 pgs.

\* cited by examiner

RFFE LNA TOPOLOGY SUPPORTING BOTH NONCONTIGUOUS INTRABAND CARRIER AGGREGATION AND INTERBAND CARRIER AGGREGATION

CROSS-REFERENCE TO RELATED APPLICATIONS—CLAIM OF PRIORITY

This application is a continuation application of U.S. application Ser. No. 17/010,311, "RFFE LNA Topology Supporting Both Noncontiguous Intraband Carrier Aggregation and Interband Carrier Aggregation", filed Sep. 2, 2020, to issue on May 17, 2022 as U.S. Pat. No. 11,336,243, which is incorporated herein by reference in its entirety. Application Ser. No. 17/010,311 is a continuation application of U.S. application Ser. No. 16/279,487, "RFFE LNA Topology Supporting Both Noncontiguous Intraband Carrier Aggregation and Interband Carrier Aggregation", filed Feb. 19, 2019, now U.S. Pat. No. 10,771,025, issued Sep. 8, 2020, which is incorporated herein by reference in its entirety.

BACKGROUND

(1) Technical Field

Various embodiments described herein relate to receivers and more particularly to Radio Frequency Front End (RFFE) with low noise amplifiers for use in communications equipment configured for receiving carrier aggregation signals.

(2) Background

Many modern electronic systems include radio frequency (RF) transceivers capable of transmitting and receiving signals; examples include personal computers, wireless tablets, cellular telephones, wireless network components, televisions, cable system "set top" boxes, radar systems, etc. In communication systems that rely upon such transceivers, radio frequencies are separated into frequency bands assigned to a particular frequency range. For example, the IEEE (Institute of Electrical and Electronics Engineers) defines the following bands:

| | | |
|---|---|---|
| HF | 0.003 TO 0.03 GHz | HIGH FREQUENCY |
| VHF | 0.03 TO 0.3 GHz | VERY HIGH FREQUENCY |
| UHF | 0.3 TO 1 GHz | ULTRA HIGH FREQUENCY |
| L | 1 TO 2 GHz | LONG WAVE |
| S | 2 TO 4 GHz | SHORT WAVE |
| C | 4 TO 8 GHz | COMPROMISE BETWEEN S AND X |
| X | 8 TO 12 GHz | USED IN WW II FOR FIRE CONTROL, X FOR CROSS (AS IN CROSSHAIR). EXOTIC. |
| $K_U$ | 12 TO 18 GHz | KURZ-UNDER |
| K | 18 TO 27 GHz | KURZ (GERMAN FOR "SHORT") |
| $K_A$ | 27 TO 40 GHz | KURZ-ABOVE |
| V | 40 TO 75 GHz | |
| W | 75 TO 110 GHz | W FOLLOWS V IN THE ALPHABET |
| MM OR G | 110 TO 300 GHz | MILLIMETER |

One example of a modern electronic system that relies upon transceivers that transmit and receive RF signals is the cellular telephone system. For maximum compatibility in North American 2G/3G/4G, cellular telephones are typically capable of handling dual-band 800 MHz Cellular or 1900 MHz PCS signals. In many markets, 4G data (LTE, WiMAX) transmitted and received by such cellular telephones is modulated on signals operating at frequencies of 700 MHz, 1700-2100 MHz, 1900 MHz and 2500-2700 MHz. Channels are assigned to a narrower range of frequencies within each band. Typically, RF signals to be transmitted are modulated within one of the channels of a selected band.

Radio frequency (RF) transceivers capable of receiving such signals comprise a receiver front end circuit that typically includes a low noise amplifier ("LNA"). The LNA is responsible for providing the first stage amplification to a signal received within the communications receiver. The operational specifications of the LNA are very important to the overall quality of the communications receiver. Any noise or distortion in the input to the LNA will get amplified and cause degradation of the overall receiver performance. Accordingly, the sensitivity of a receiver is, in large part, determined by the quality of the receiver front end circuit and in particular, by the quality of the LNA.

In some cases, such as the case of cellular telephones noted above, the LNA is required to operate over a relatively broad frequency band and to amplify signals having several modulated baseband or intermediate frequency (IF) signals. In some cases, the LNA of a cellular telephone may be required to amplify a received signal having multiple modulated IF or baseband signals. For example, some cellular telephones are required to receive an intraband noncontiguous carrier aggregation (CA) signal. A CA signal can have two channels (or IF carriers) having frequencies that are not adjacent to one another, but which lie in the same frequency band. For example, a CA signal may have two non-adjacent channels within a cellular frequency band defined by 3rd Generation Partnership Project (3GPP), a well-known industry standard setting organization.

In the case in which a receiver is required to receive a CA signal, such as a cellular telephone that is compliant with the Release 11 of the 3GPP communications industry standard, the LNA typically amplifies the received signal and provides the amplified output signal to a passive splitter.

FIG. 1 is an illustration of a portion of a cellular telephone receiver front end circuit in which an LNA 101 is coupled to a variable attenuator 103. A bypass switch 105 allows the variable attenuator to be optionally shunted. The signal is then coupled to a single pole, three throw mode selector switch 107 that allows the output of the LNA 101 to be selectively coupled to only a first downconverter and baseband circuitry (DBC) 109, a second DBC 111 or both the first and the second DBC 109, 111.

When the mode selector switch 107 is in the first position (i.e., Single Channel mode 1), the output of the LNA 101 is coupled directly to the first DBC 109. In the second position (i.e., Split mode), the output of the LNA 101 is coupled through a passive power splitter 113 to both the first and second DBC 109, 111. In the third position (i.e., Single Channel mode 2), the output of the LNA 101 is coupled to only the second DBC 111.

Several limitations arise from the architecture shown in FIG. 1. The first limitation is the amount of isolation that can be achieved between the first and second DBC 109, 111. Typically, a well-manufactured 3 dB splitter can achieve approximately 18-20 dB of isolation between outputs at the center frequency for which the splitter 113 is designed to operate. Signals that are cross-coupled from one DBC to the other will typically result in interference and distortion that will result in an overall reduction in sensitivity of the receiver.

Furthermore, passive splitters typically are designed to operate optimally in a relatively narrow frequency range. That is, passive splitters, by their nature are narrow band devices. As the frequency of the signal coupled through the splitter 113 deviates from the optimal frequency for which the splitter was designed, the output-to-output isolation will degrade. Due to the limitations of the splitters currently available, and because receivers that are designed to handle CA signals must operate in a relatively broad frequency range, the desired isolation between the DBCs 109, 111 is difficult to achieve.

Furthermore, power splitters such as the splitter 113 shown in FIG. 1, have significant loss. Since 3 dB power splitters split the power in half, even an ideal splitter will result in a 3 dB reduction in power. In addition, most splitters will have an additional 1.0 to 1.5 dB of insertion loss. The insertion loss, like the output-to-output isolation, will typically get worse as the frequency of the signals applied deviates from the center frequency for which the splitter was designed to operate.

Still further, the losses encountered in the mode selection switch 107 and the splitter 113 lead to a need for more gain. This results in reductions in linearity (as typically characterized by measuring the "third order intercept") and degradation of the noise figure of the receiver when operating in Split mode.

Therefore, there is a currently a need for a CA capable receiver front end circuit that can operate in Split mode with high output-to-output isolation, without degraded third order intercept and noise figure, and with relatively low front end losses.

Still further, in several cases today, it is necessary to have more than two inputs, each of which may receive intraband (Intra-B) CA signals or an interband (Inter-B) CA signals at different frequencies. Due to limitations in the capability of the LNAs to handle broad frequency ranges, it may be necessary to have several LNAs, each tuned to amplify signals in a particular frequency range. However, restrictions on the size of a receiver front end circuit in which the LNA resides may place limits on the number of LNAs that can be present, or at least make it necessary to efficiently use the real estate in the integrated circuits of the FEC.

Accordingly, there is currently a need for an efficient, flexible FEC capable of handling several possible signals, including Intra-B CA signals in different frequency ranges and Inter-B CA signals in different frequency ranges, as well as non-CA signals.

SUMMARY OF THE INVENTION

A receiver front end circuit (FEC) is disclosed herein that can efficiently amplify and process single-band and multi-band RF signals with low noise, high linearity, high isolation and small area.

A number of embodiments of the claimed invention have been described. It is to be understood that various modifications may be made without departing from the spirit and scope of the invention. For example, some of the steps described may be order independent, and thus can be performed in an order different from that described. Further, some of the steps described may be optional. Various activities described with respect to the methods identified can be executed in repetitive, serial, or parallel fashion. It is to be understood that the following descriptions are intended to illustrate and not to limit the scope of the claimed invention, which is defined by the scope of the following claims, and that other embodiments are within the scope of the claims.

DESCRIPTION OF THE DRAWINGS

Like reference numbers and designations in the various drawings indicate like elements.

DETAILED DESCRIPTION OF THE INVENTION

Figure 1:
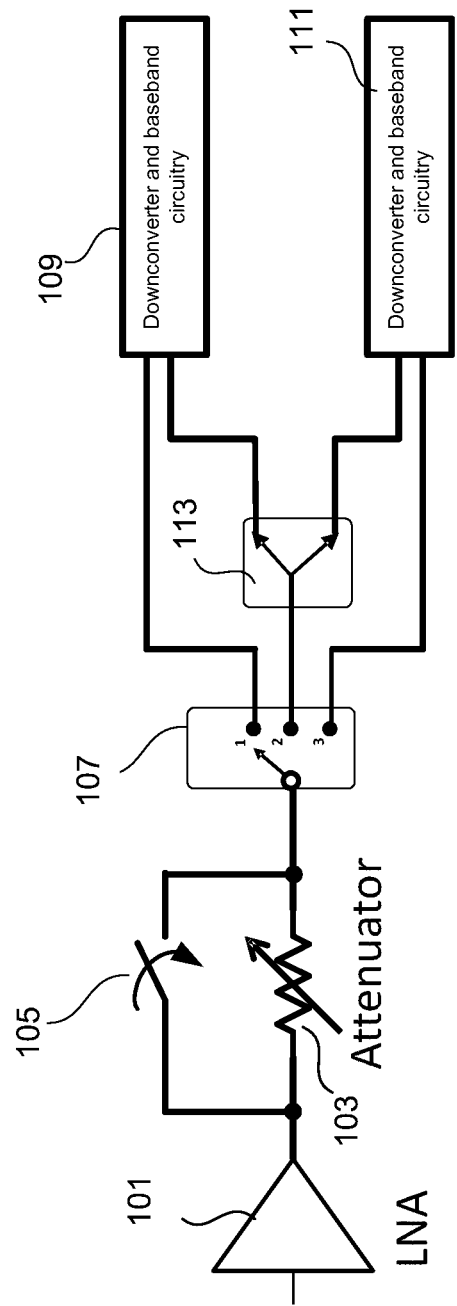
FIG. 1 is an illustration of a receiver front end circuit of a prior art communications receiver.
Figure 2A:
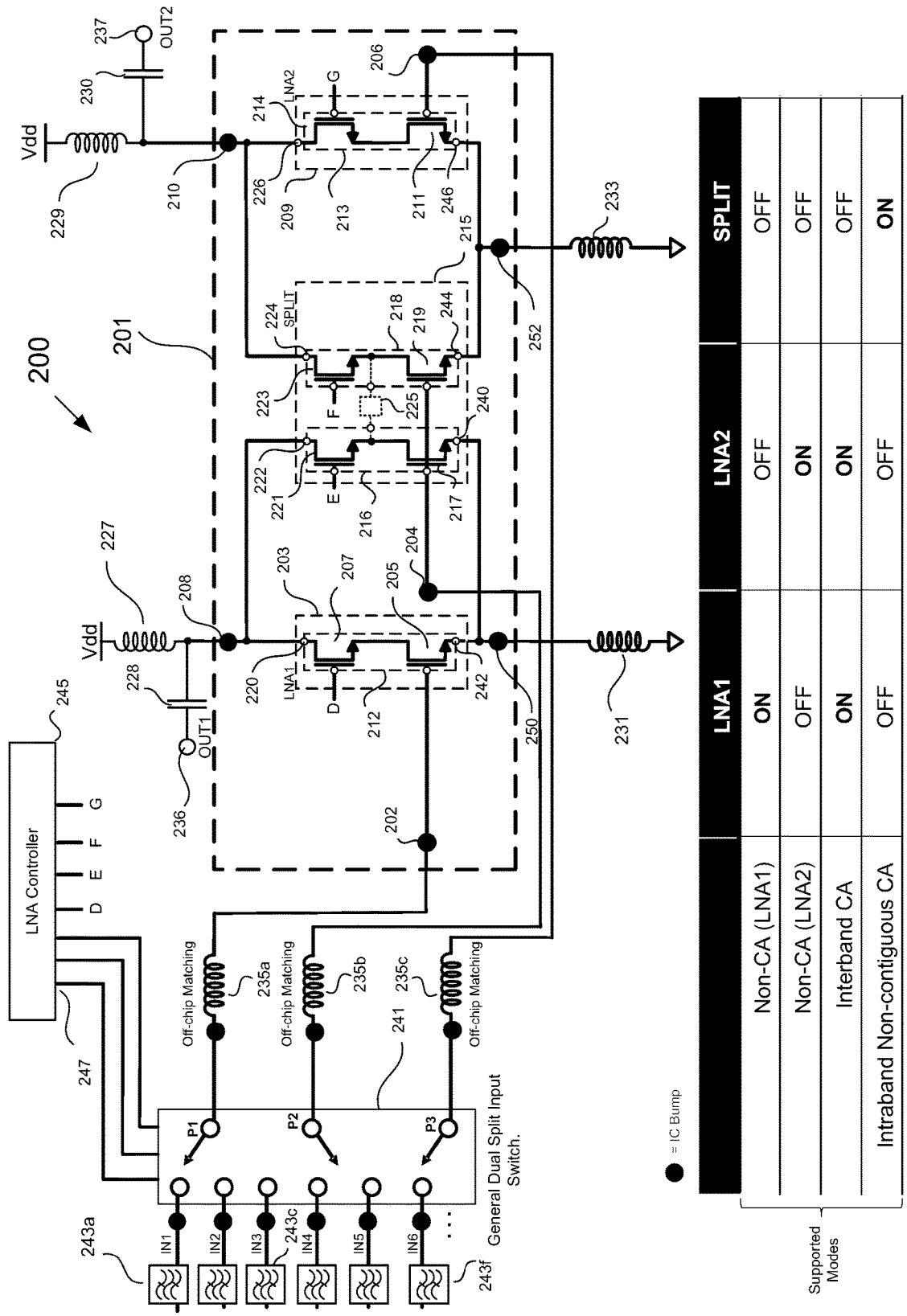
FIG. 2A is an illustration of an LNA circuit in accordance with some embodiments of the disclosed method and apparatus.
Figure 2B:
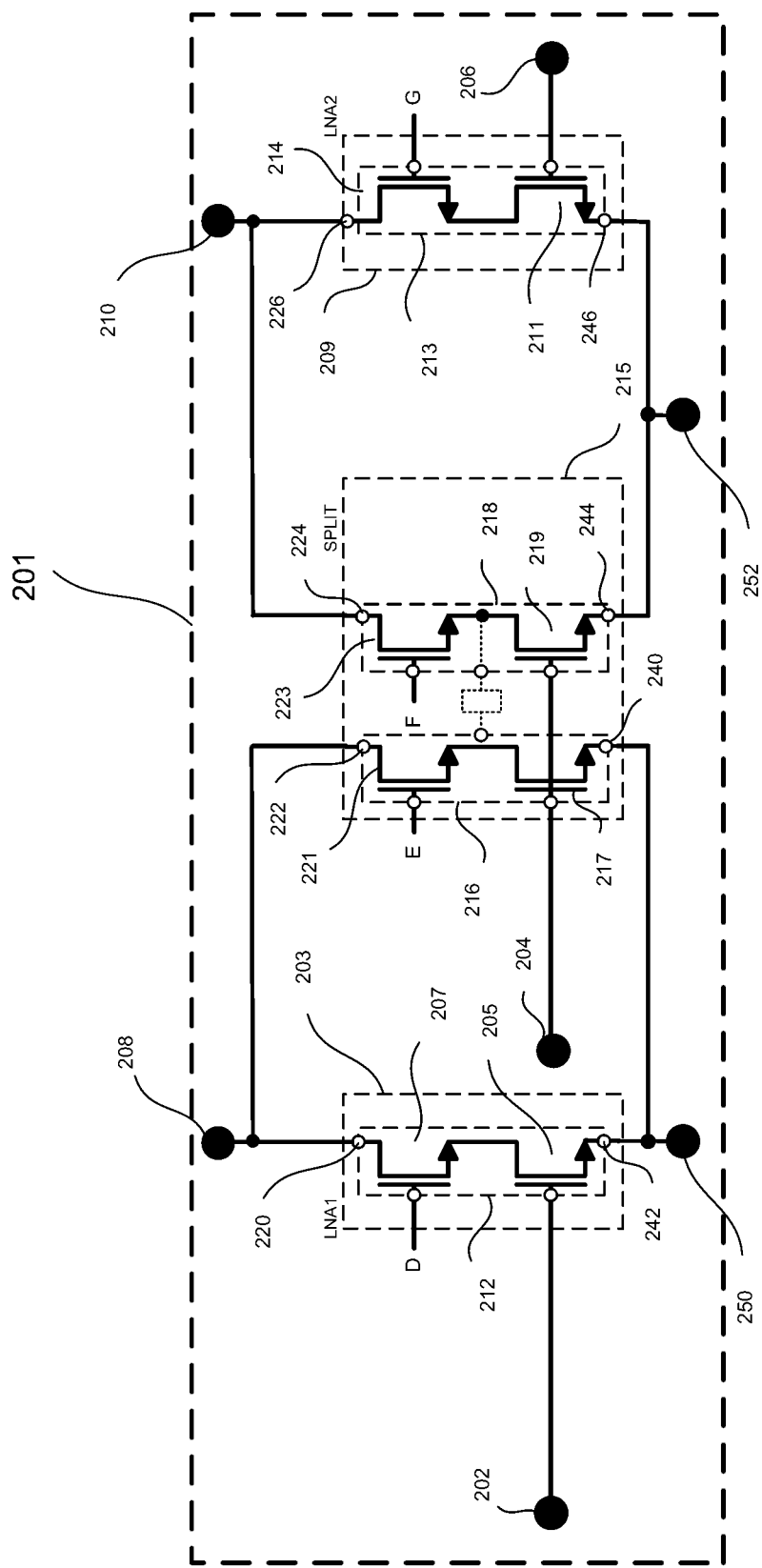
FIG. 2B is an illustration of the receiver portion of a front end circuit (FEC) having an LNA such as the LNA shown in FIG. 2A, in accordance with some embodiments of the presently disclosed method and apparatus.

FIG. 2A is an illustration of the receiver portion of a front end circuit (FEC) 200 (hereafter referred to as a "receiver FEC") in accordance with some embodiments of the presently disclosed method and apparatus. The receiver FEC 200 comprises a low noise amplifier (LNA) circuit 201. FIG. 2B is an illustration of the LNA circuit 201 with the LNA circuit 201 isolated for easier viewing. In some embodiments, the LNA circuit 201 is an LNA integrated circuit (LNAIC) that has three circuit inputs 202, 204, 206, two circuit outputs 208, 210 and various power and ground connections. In some embodiments, control terminals are also provided to allow control of the LNA circuit 201 by an outside LNA controller 245. Alternatively, the LNA controller 245 is fabricated on the LNAIC 201. The LNA circuit 201 comprises two single mode LNAs, LNA1 203, LNA2 209, and a split LNA 215.

The receiver FEC 200 is a flexible and efficient circuit for receiving and amplifying non-carrier aggregated (non-CA) signals, Inter-B carrier aggregated (Inter-CA) signals and intraband carrier aggregated (Intra-B CA) signals. Inter-B CA signals are signals that include two or more frequencies of different bands. Intra-B CA signals are signals that include two or more signals that are separated in frequency, but that lie within the same band. The LNA controller 245, or other control system, provides control over the three LNAs 203, 209, 215 of the receiver FEC 200. By controlling the LNAs, a mode of operation can be selected that is appropriate to the particular signal being received. For example, for the embodiment shown in FIG. 2, the receiver FEC 200 can receive one of the following four types of signals: (1) a non-carrier aggregated (non-CA) signal in a frequency range for which LNA1 203 is tuned; (2) a non-carrier aggregated (non-CA) signal in a frequency range for which LNA2 209 is tuned; (3) an Inter-B CA signal having a first signal in a first frequency band to which LNA1 203 is tuned aggregated with a signal in a second frequency band to which LNA2 209 is tuned; and (4) an intraband CA signal having a first signal in a first frequency band to which the split LNA 215 is tuned aggregated with a second non-contiguous signal in the same first frequency band. When receiving signal type (1), LNA1 203 is turned on and the other LNAs 209, 215 are turned off. When receiving signal type (2), LNA2 209 is turned on and the other LNAs 203, 215 are turned off. When receiving signal type (3), both LNA1 203 and LNA2 209 are turned on and the split LNA 215 is turned off. When receiving signal type (4), the split LNA 215 is turned on and LNA1 203 and LNA2 209 are turned off.

In some embodiments, the two single mode LNAs 203, 209 each comprise one cascode amplifier stage (CAS) 212, 214. In some such embodiments, the two CASs 212, 214 are essentially the same. Therefore, for the sake of brevity, only the first CAS 212 is described in detail.

The CAS 212 is a two-transistor amplifier. The first transistor 205 is configured as a "common source" input transistor. The second transistor 207 is configured as a "common gate" output transistor. In some embodiments, the transistors 205, 207 are field effect transistors (FETs). In other embodiments, the CAS 212 may have additional transistors (i.e., two or more stages and/or stacked transistors), not shown in FIG. 2 for the sake of simplicity. Accordingly, it should be understood that the simple two-transistor CAS 212 is provided as one example of a CAS in accordance with the presently disclosed method and apparatus. However, there are a relatively large number of alternative amplifiers known to those skilled in the art that may be used to implement the CAS 212.

In the CAS 212 shown in FIG. 2, the source of the output FET 207 is coupled to the drain of the input FET 205. The signal output 220 of the CAS 212 is taken from the drain of the output FET 207. The CAS 212 can be turned on or off by a control signal D coupled to the gate of the output FET 207. In some embodiments, an LNA controller 245 provides the control signal D. In some such embodiments, the LNA controller 245 may be fabricated on the same LNAIC as the LNA circuit 201 (i.e., on the same integrated circuit (IC) as the LNAs 203, 209, 215). Alternatively, the LNA controller 245 and the LNA circuit 201 may be fabricated on separate ICs.

Input signals to be amplified by the first LNA, "LNA1" 203, are applied though a circuit input 202 coupled to the gate of the input FET 205. It should be understood that in some embodiments the CAS 212 is the only circuitry in the LNA1 203. However, in other embodiments, LNA1 203 may include other circuitry outside the CAS 212 not shown in FIG. 2. Such circuitry might include components used for impedance matching, for example. The output of LNA1 203 is taken from the drain of the output FET 207 and is coupled to the circuit output 208 of the LNA circuit 201. In some embodiments in which the LNA circuit 201 is fabricated as an IC, the circuit input 202 and the circuit output 208 are solder bumps that provide a connection point for both electrically and mechanically connecting the LNA circuit 201 to other components of the receiver FEC 200, such as off-chip inductors 235, 227.

In some embodiments, the input to the second LNA, "LNA2" 209, is coupled to the circuit input 206. In particular, the gate of the input FET 211 of the CAS 214 of LNA2 209 is coupled to a circuit input 206. In some such embodiments, similar to the circuit input 202, the circuit input 206 is a solder bump. A control signal G coupled to the gate of the output FET 213 of the CAS 214 in second LNA circuit 209 can be used to turn LNA2 209 on and off. In some embodiments, the control signal G is output from the LNA controller 245. In some embodiments, the only circuitry in LNA2 209 is the CAS 214. Alternatively, other components not shown may be provided within the LNA2 209 that are outside the CAS 214. The output of LNA2 209 is taken from the drain of the output FET 213. In some embodiments, the output of LNA2 209 is coupled to a solder bump that serves as the circuit output 210.

The third LNA, the "split LNA" 215, comprises two CASs 216, 218. In some embodiments, each CAS 216, 218 is essentially the same as the CAS 212 of single mode LNA1 203. However, the gates of the input FETs 217, 219 are coupled together and to the circuit input 204. In this embodiment, each of the two CASs 216, 218 of the split LNA 215 can be independently turned on or off. The first CAS 216 is controlled (i.e., turned on or off) by a control signal E coupled to the gate of the output FET 221 within the CAS 216. The second CAS 218 is controlled by a control signal F coupled to the gate of the output FET 223. In some embodiments, the gates of the two output FETs 221, 223 are coupled together and controlled by one control signal, since in most cases, the two CASs 216, 218 of the split LNA 215 are turned on or off together. In some embodiments, the control signals E, F are provided by the LNA controller 245. Furthermore, in some embodiments, a component 225 is coupled between the drain of the input FET 217 of the first CAS 216 and the drain of the input FET 219 of the second CAS 218. In some embodiments, the component 225 is a capacitor. Alternatively, the component 225 is either a resistor, a capacitor and resistor in series or a capacitor and resistor in parallel.

The split LNA 215 has two signal outputs. The first signal output of the split LNA 215 is taken from a signal output 222 of the CAS 216. The signal output of the CAS 216 is taken from the drain of the output FET 221 of the first CAS 216. The first signal output of the split LNA 215 is also coupled to the signal output 220 of LNA1 203. The second signal output 224 from the split LNA 215 is coupled to the signal output 224 of the CAS 218. The signal output 224 of the CAS 218 is taken from the drain of the output FET 223 of the second CAS 218 and coupled to the signal output 226 of LNA2 209. The output of LNA2 209 is coupled to the CAS signal output 226 of the CAS 214, which is taken from the drain of the output FET 213 and coupled to the circuit output 210 of the LNA circuit 201.

The source of the input FET 217 of the first CAS 216 of the split LNA 215 is coupled to a degeneration output 240 of the CAS 216. The degeneration output 240 is coupled to a degeneration output 242 of the CAS 212. The degeneration output 242 of the CAS 212 is coupled to the source of the input FET 205 of CAS 212 and to a degeneration component 231. In some embodiments, the degeneration component 231 is an inductor.

The source of the input FET 219 of the second CAS 218 of the split LNA 215 is coupled to a degeneration output 244 of the CAS 218. The degeneration output 244 of the CAS 218 is coupled to the degeneration output 246 of the CAS 214. The degeneration output 246 is coupled to the source of the input FET of CAS 214 and to a second degeneration component 233. In some embodiments, the second degeneration component 233 is an inductor. In some embodiments in which the degeneration components are not on the LNA circuit 201, solder bumps 250, 252 are provided to couple the degeneration outputs 240, 242, 244, 246 to the degeneration components 231, 233.

The four control signals D, E, F, G allow the LNA controller 245 to control the mode of the LNA circuit 201. In addition, in some embodiments, a general dual split input switch 241 selectively couples one of a plurality of input filters 243 to one of the circuit inputs 202, 204, 206. In some embodiments, each input signal is coupled through an inductor 235, 237, 239. In some embodiments in which the LNA circuit 201 is an LNAIC 201, the inductors are "off-chip" (i.e., not fabricated on the LNAIC 201). In some such embodiments, the input switch 241 is on the LNAIC 201 and the filters 243 are not on the LNAIC 201. However, in other embodiments, the inductors 235, 237, 239 may be fabricated on the LNAIC 201. Furthermore, the input switch 241 may be off-chip. Still further, one or more of the filters 243 may be on-chip. In other embodiments, any combination of on and off chip configurations is possible.

Several operational modes can be selected for the receiver FEC 200 by determining the state of the input switch 241 and the control signals D, E, F, G. For example, in the first line of a table provided in FIG. 2, a non-carrier aggregated (non-CA) signal having a frequency in the frequency range appropriate to be amplified by LNA1 203 is received. In this case, the signal is routed through the input switch 241 to the circuit input 202 (and thus to LNA1 203). In that case, the control signal D is set to turn on LNA1 203. The control signals E, F, G are set to turn off the CAS 214 in LNA2 209 and the two CASs 216, 218 of the split LNA 215. The resulting output from the receiver FEC 200 is an amplified non-CA signal at the first circuit output 208.

The second line of the table provided in FIG. 2 shows a configuration appropriate for the case in which a non-carrier aggregated signal is received that has a frequency in a frequency range appropriate to be amplified by LNA2 209. In this case, the signal is routed through the input switch 241 to the circuit input 204 (and thus to LNA2 209). The control signal G is set to turn on LNA2 209. The control signals D, E, F are set to turn off the CAS 212 in LNA1 203 and the two CASs 216, 218 of the split LNA 215. The resulting output from the receiver FEC 200 is an amplified non-CA signal at the second circuit output 210.

The third line of the table provided in FIG. 2 shows the case in which an Inter-B CA signal is received by the receiver FEC 200. A first one of the filters 243a is tuned to filter that portion of the signal that is appropriate to be amplified by LNA1 203. The output of that filter 243a is routed by the input switch 241 to circuit input 202 and thus applied to the input of LNA1 203. The portion of the signal that is appropriate to be amplified by LNA2 209 is filtered by a second one of the filters 243f. The output of the second one of the filters 243f is routed through the input switch 241 to the circuit input 206 and thus to the input of LNA2 209. The control signal G to LNA2 209 is set to turn on LNA2 209. Accordingly, an amplified signal in the frequency appropriate for LNA1 203 is output through the first circuit output 208 and an amplified signal in the frequency appropriate for LNA2 209 is output through the second circuit output 210. The two CASs 216, 218 of split LNA 215 are turned off by the control signals E, F.

The fourth line of the table provided in FIG. 2 shows the case in which an intraband CA signal is received by the receiver FEC 200. A third one of the filters 243c is tuned to filter that portion of the signal that is appropriate to be amplified by the split LNA 215. The output of that filter 243c is routed by the input switch 241 to circuit input 204 and thus applied to the input of split LNA 215. The control signals E, F to the split LNA 215 is set to turn on both CASs 216, 218 of the split LNA 215. The CAS 212 of LNA1 203 and CAS 214 of LNA2 209 are turned off by the control signals D, G. Accordingly, an amplified signal in the frequency appropriate for the CAS 216 of the split LNA 215 is output through the first circuit output 208 and an amplified signal in the frequency appropriate for the second CAS 218 of the split LNA 215 is output through the second circuit output 210. A first output load matching element 227 is coupled between the first circuit output 208 and a reference source (such as Vdd). In addition, a first DC blocking and output impedance matching capacitance 228 is coupled between the first circuit output 208 and a first FEC output 236. Similarly, a second output load matching element 229 is coupled between the second circuit output 210 and a reference source (such as Vdd). In addition, a second DC blocking and output impedance matching capacitance 230 is coupled between the second circuit output 210 and a second FEC output 237.

Figure 3:
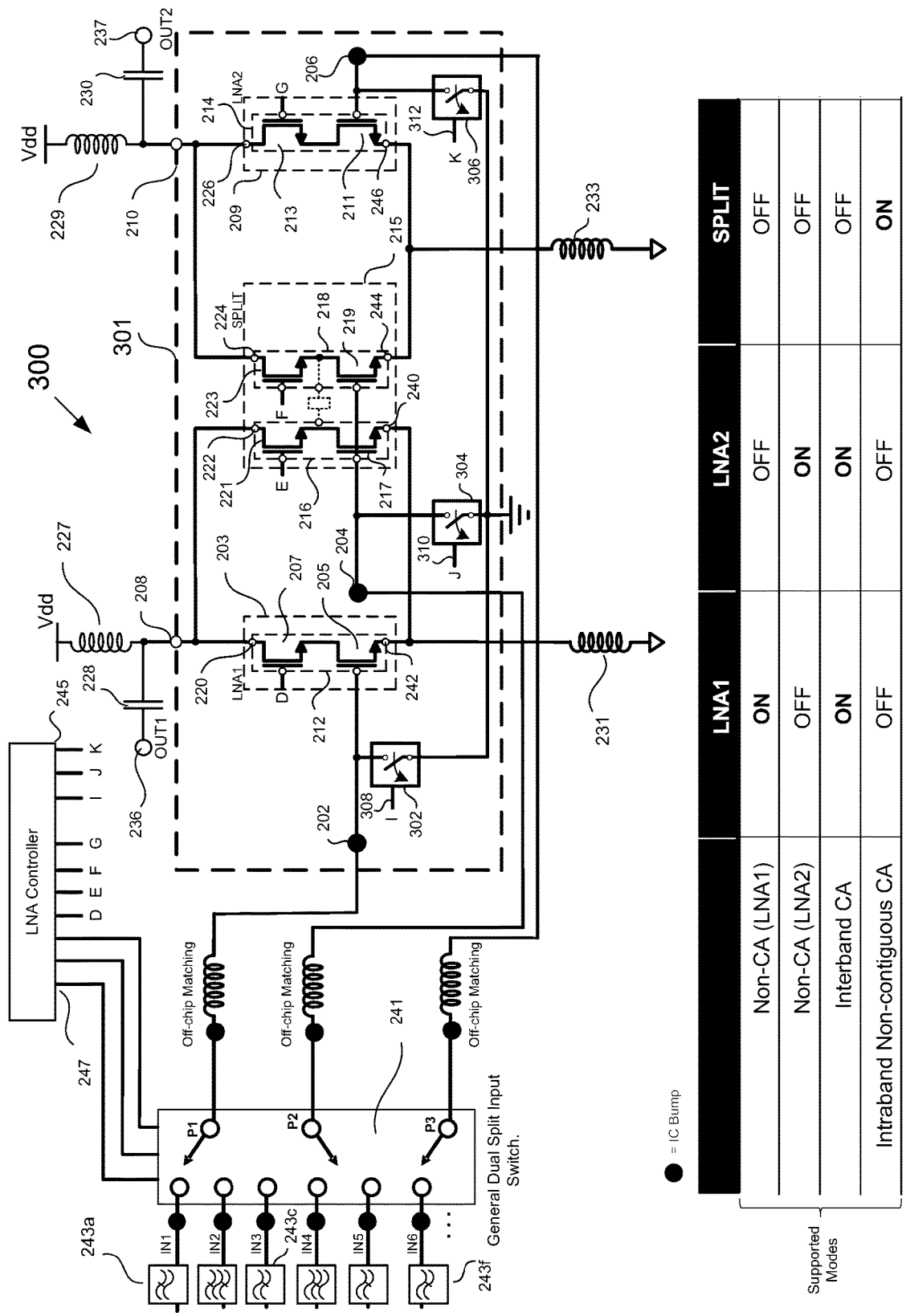
FIG. 3 is an illustration of a receiver portion of an FEC in which gate switches are coupled to gates of input FETs to allow the gates to be coupled to a known potential.

Various embodiments of the disclosed method and apparatus present advantages over the prior art. Examples of some of these advantages include the following:

Single Mode performance is not degraded by the presence of the split mode capability;

Single Mode and Split Modes are more independent of each other, allowing for better flexibility to optimize the design in both modes;

Dual Split LNA has the ability to amplify signals from two different inputs simultaneously, i.e. similar functionality as two single LNAs. This is done by reusing much of the hardware already required for split mode, thus resulting in minimal overall die size. This feature allows the Dual Split LNA to function as a split LNA to support NC IB CA, and also as two single LNAs to support interband CA;

Area savings of an LNAIC can be significant since elements of each LNA are shared with other LNAs;

Isolation between LNAs and modes of LNAs is improved;

FIG. 3 is a simplified schematic of a receiver FEC 300 in which a gate switch 302 is added to the gate of the input FET 205 to pull down the gate of the input FET 205 to a known potential, such as ground, when LNA1 is off. Similarly, gate switches 304, 306 are provided to selectively pull down the gates of the other FETs, 211, 217, 219 to a known potential. In some embodiments, control signals I, J, K are provided by the LNA controller 245 and allow the LNA controller 245 to selectively open and close each of the gate switches 302, 304, 306. By closing the gate switches 302, 304, 306, signals that might be inductively coupled to input routes, shared source connections and shared drain connections in CASs that are off can be shunted to ground.

In addition to advantages listed above for the embodiment of FIG. 2, the gate switches of the embodiment shown in FIG. 3 increase isolation between different modes of operation and improve the NF performance of the FEC by shorting input nodes of OFF LNAs to ground.

Figure 4:
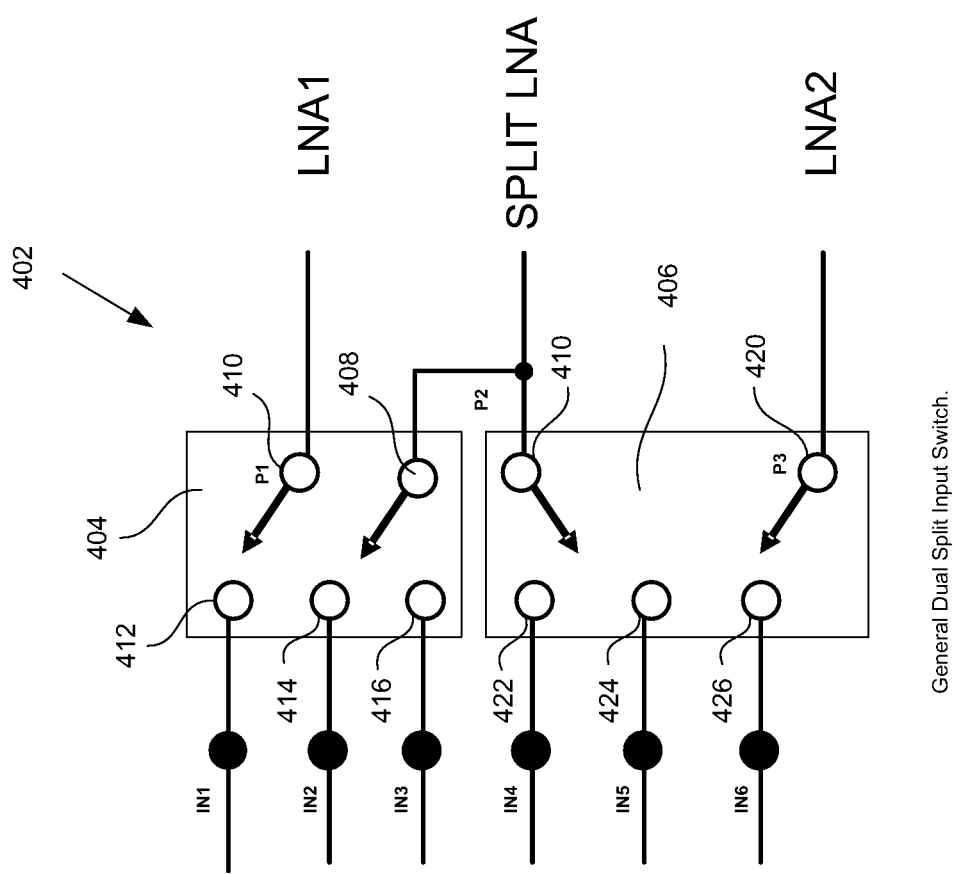
FIG. 4 is a simplified schematic of an input switch having two sections.

FIG. 4 is a simplified schematic of an input switch 402, having two sections 404, 406. The input switch 402 is a simplification of the input switch 241 shown in FIG. 2, which has three poles and six throws. In the input switch 241, any of the three poles can be coupled to any of the six throws. Such a switch can be relatively complex to implement. The input switch 402 provides a simplification that is more limited, but is easier to implement. The first section 404 is a two-pole, three-throw switch that allows either of the poles 408, 410 to connect to any of the three throws 412, 414, 416. The second section 406 is a second two-pole, three-throw switch that operates similarly. The second pole 408, 410 of each section 404, 406 are coupled together and coupled to the input of the split LNA 215. Since the second pole 408, 410 of each section 404, 406 are coupled together, the input of the split LNA 215 can be coupled to any of the 6 throws 412, 414, 416, 422, 424, 426. However, the pole 410 coupled to LNA1 203 and the pole 420 coupled to LNA2 209 are limited in that each can only be coupled to one of the three throws of associated section. In some implementations, such a simplification of the input switch is appropriate, since an input signal that can only be routed to one of the LNAs can nonetheless be routed to the desired output of the receiver FEC 200 by an output switch. Accordingly, as long as each input signal can be routed to at least one of the LNAs, LNA1 203 or LNA2 209, an appropriate output switch (not shown) can ensure that any input signal can be routed to any output of the receiver FEC 200.

Figure 5:
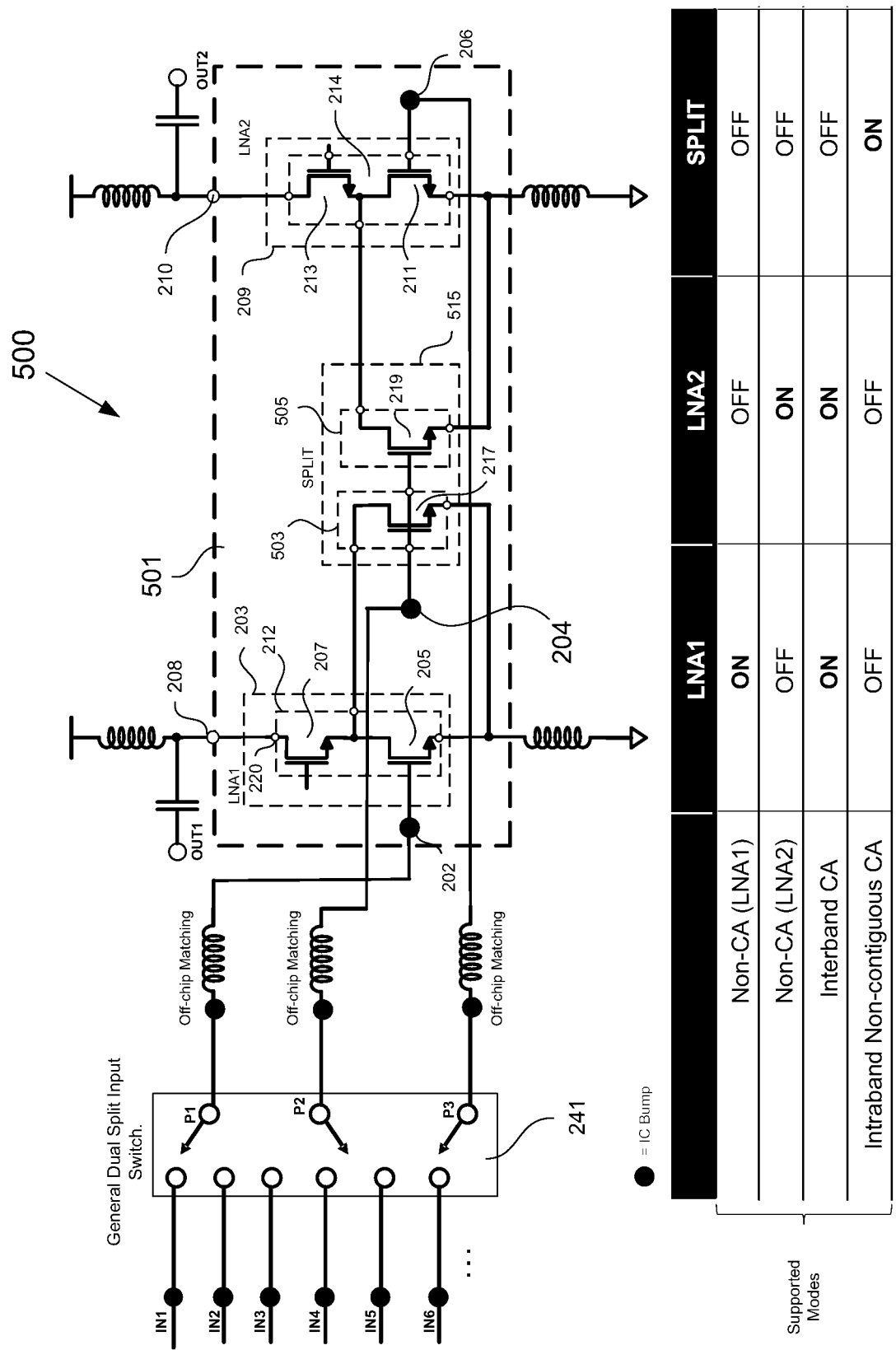
FIG. 5 is an illustration of a receiver portion of an FEC in accordance with an embodiment in which the split LNA is implemented with two input FETs and having output FETs that are shared with LNA1 and LNA 2.

FIG. 5 is an illustration of a receiver FEC 500 in accordance with an embodiment in which the split LNA 515 is implemented with two input FETs 217, 219 and the output FETs are shared with LNA1 203 and LNA2 209. That is, the input FETs 217, 219 share the output FETs 207, 213 of LNA1 203 and LNA2 209, respectively. The drain of the first input FET 217 of the split LNA 515 is coupled to the source of the output FET 207 of LNA1 203. The source of the input FET 217 of the split LNA 515 is coupled to the source of the input FET 205 of LNA1 203. Similarly, the drain of the second input FET 219 of the split LNA 515 is coupled to the source of the output FET 213 of LNA2 209. The source of the input FET 219 of the split LNA 515 is coupled to the source of the input FET 211 of LNA2 209. Configuring the split LNA 515 in this way changes the location of the additional capacitive loading present in the circuit by the addition of the split mode support (i.e., from the nodes 208 and 210 as in FIG. 2, to the drains of FETs 205 and 211). The additional capacitive loading at nodes 208 and 210 increases the reactance of the node impedance, which causes lower max achievable gain and narrower matching bandwidth. When the loading is instead present at the drains of FETs 205 and 211 as in FIG. 5, the previous degradations are reduced, but the noise figure can be worsened due to the additional output noise contribution of the output FETs 220 or 213 caused by the parasitic current path through the capacitive loading of input FETs 203 or 505. Accordingly, in some implementations, the configuration of FIG. 5 may be preferable. However, in other implementations, the configuration of FIG. 2 may be preferable. It should be noted that the gate switches 302, 304, 306 of FIG. 3 (not shown in FIG. 5 for the sake of simplicity) may be used in the receiver FEC 500 of FIG. 5. In addition, the LNA controller 245 is not shown in the receiver FEC 500 of FIG. 5 for the sake of simplicity. However, the LNA 245 may be provided in the receiver FEC 500. Furthermore, the input switch 402 shown in FIG. 4 may be used in place of the input switch 241 show in FIG. 5.

In addition to those advantages noted above, the embodiment shown in FIG. 5 saves additional area and can result in higher max achievable gain and matching bandwidth, at the expense of higher noise figure.

Figure 6:
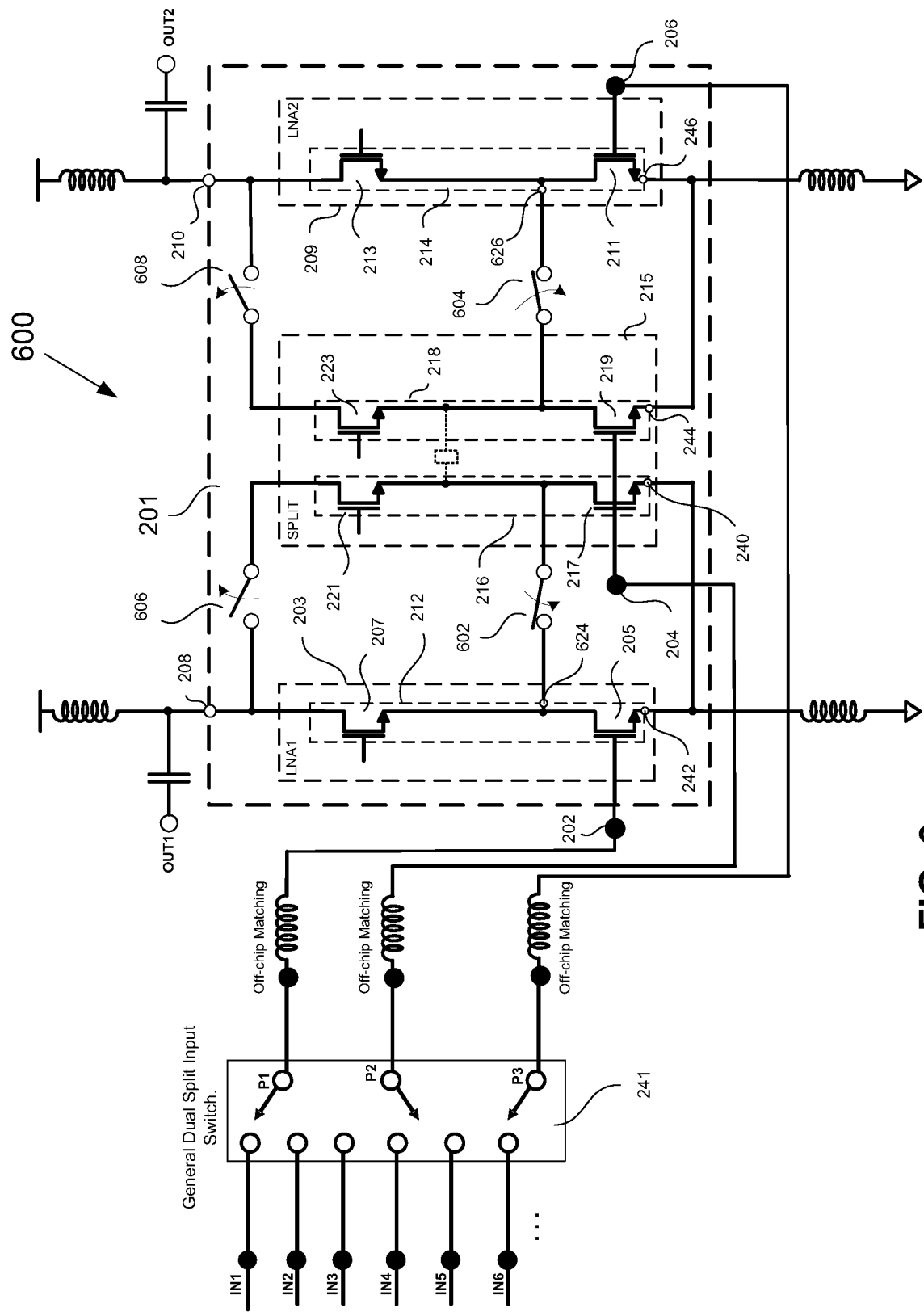
FIG. 6 is an illustration of a schematic of an embodiment of the presently disclosed method and apparatus in which a choice can be made between the benefits of the circuit of FIG. 2A and the benefits of the circuit of FIG. 5.

FIG. 6 is an illustration of a schematic of an embodiment of the presently disclosed method and apparatus in which a choice can be made between the benefits of the circuit of FIG. 2 in which the split LNA 215 comprises four FETs and the benefits of the circuit of FIG. 5 in which the split LNA 515 comprises only two FETs. That is, the split LNA 215 comprises four FETs 217, 219, 221, 223 the same as the split LNA 215 of FIG. 2. However, a first switch 602 selectively connects the drain of the input transistor 217 to the drain of the input transistor 205 of the first CAS 212 through an input transistor drain node 624 of the first CAS 212. A second switch 604 selectively connects the drain of the input transistor 219 to the drain of the input transistor 211 of the second CAS 214 through an input transistor drain node 626 of the second CAS 214. These two switches 602, 604 are provided to allow the output FETs 221, 223 to be removed from the active circuit while maintaining cascode operation of the second CAS 214 through cascode transistor 207. A third switch 606 and a fourth switch 608 are provided to couple the drains of the output FETs 221, 223 of the split LNA 215 to the drains of the output FETs 207, 209 of LNA1 203 and LNA2 209, respectively. These switches (602, 604, 606, and 608) may be implemented as FET switches. Accordingly, by opening the first two switches 602, 604 and closing the second two switches 606, 608, the receiver FEC 600 operates the same as the receiver FEC 200 of FIG. 2. However, when the first two switches 602, 604 are closed and the second two switches 606, 608 are open, the split LNA 215 of FIG. 6 operates similar to the split LNA 515 of FIG. 5. It should be clear to those skilled in the art that the gate switches 308, 310, 312 shown in FIG. 3 may be provided for use with the receiver FEC 600 of FIG. 6. Furthermore, the input switch 402 shown in FIG. 4 may be used in place of the input switch 241 show in FIG. 6. In addition, the LNA controller 245 is not show in the receiver FEC 600 of FIG. 6 for the sake of simplicity. However, the LNA 245 may be provided in the receiver FEC 600.

The embodiment shown in FIG. 6 has the advantage of enabling customization of an LNAIC to allow changes in the configuration of the LNAIC after manufacturing. This allows the LNAIC performance to be altered to match several different requirements, thereby improving the overall system performance. This capability can be used to reduce the size of the inventory necessary to handle various different performance requirements.

Figure 7:
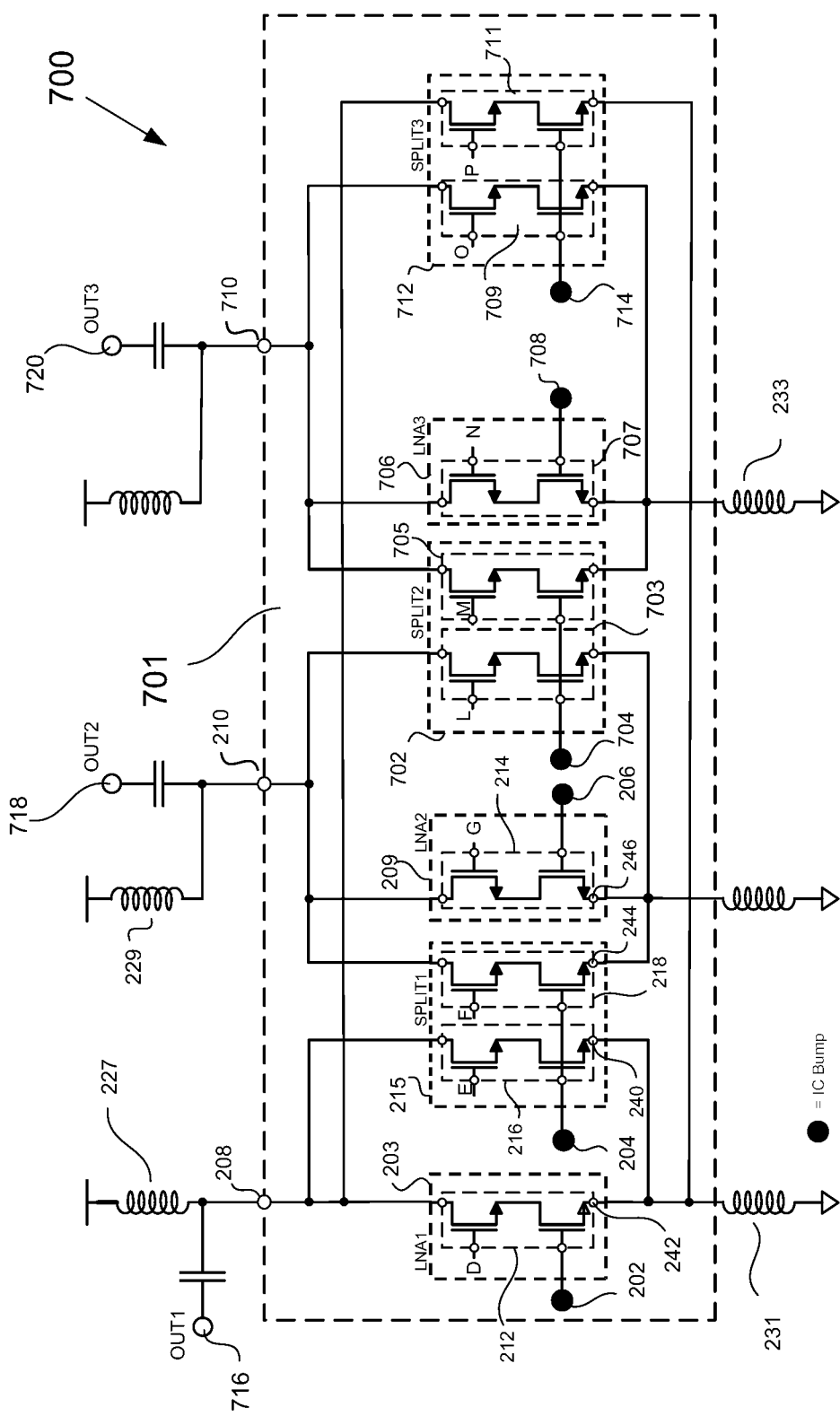
FIG. 7 is an illustration of a schematic of a receiver FEC that is an extension of the receiver LNA circuit shown in FIG. 2B.

FIG. 7 is an illustration of a schematic of a receiver FEC 700 that is an extension of the receiver FEC 200 shown in FIG. 2. That is, the receiver FEC 700 has an LNA circuit 701 comprising six LNAs 203, 209, 215, 702, 706, 712. A first of the three is a single mode LNA, "LNA1" 203, that comprises one CAS 203. A second is a single mode LNA, "LNA2" 209, that comprises one CAS 214. A third is a single mode LNA, "LNA3" 706, that comprises CAS 707. The CAS 707 is similar to the CAS 203 and CAS 214 described above with respect to the single mode LNA1 203 and LNA2 209 of FIG. 2.

In addition, the LNA circuit 701 comprises three split LNAs 215, 702, 712, similar to the split LNA 215 described above with respect to FIG. 2 as well as three single mode LNAs, 203, 209, and 706, each similar to the two LNAs 203, 209 of the embodiment of FIG. 2. Each split LNA is associated with two single mode LNAs. For example, the split-1 LNA 215 is associated with single mode LNA1 203 and LNA2 209. In this context, being associated means that the first signal output of the split-1 LNA (i.e., the signal output 222 of the first CAS 221) is coupled to the signal output of LNA1 203 (i.e., the CAS signal output 220 of the CAS 212). Furthermore, the degeneration output 240 of the first CAS 216 within the split-1 LNA 215 is coupled to the degeneration output 242 of the CAS 212 of LNA1 203. By having the signal outputs and degeneration outputs coupled, the CAS 212 of LNA1 203 is in parallel with the first CAS 216 of the split-1 LNA 215. Similarly, the second CAS 218 of the split-1 LNA is coupled in parallel with the CAS 214 of LNA2 209.

Likewise, split-2 LNA 702 is associated with single mode LNA2 209 and single mode LNA3 706. Therefore, the first CAS 703 of split-2 LNA 702 is coupled in parallel with the CAS 214 of LNA2 209 and the second CAS 705 of split-2 LNA 702 is coupled in parallel with the CAS 707 of LNA3 706.

Lastly, split-3 LNA 712 is associated with single mode LNA3 706 and single mode LNA1 203. That is, the first CAS 709 of split-3 LNA 712 is coupled in parallel with the CAS 707 of LNA3 706 and the second CAS 711 of split-3 LNA 712 is coupled in parallel with the CAS 212 of LNA1 203.

Each of the six LNAs 203, 209, 215, 702, 706, 712 has an input 202, 204, 206, 704, 708, 714. By selectively turning on or off each of the LNAs, the signal that is routed to each of the three FEC signal outputs 716, 718, 720 can be selected from among: (1) a non-CA signal coupled to a single mode LNA associated with the particular FEC signal output; (2) an intraband CA signal coupled to the one of the two split LNAs coupled to the FEC signal output; (3) an Inter-B CA signal coupled to the single mode LNA coupled to the FEC signal output. For example, a non-CA signal can be coupled to the input 202 to LNA1 203 and output through the FEC signal output 716. Alternatively, a non-CA signal can be coupled to either the input 206 to single mode LNA2 209 or to the input 708 to single mode LNA3 706 and output from the FEC signal output 718, 720 associated with the input. In yet another scenario, an intraband CA signal can be coupled to the input to one of the three split LNAs 215, 702, 712 and two carrier aggregated signals can be output on the two signal outputs associated with the split LNA to which the input signal is coupled. In yet another scenario, an Inter-B CA signal can be coupled to two or more of the three single mode LNAs 203, 209, 706 to allow the CA signals of each band to be output through one of the three FEC signal outputs.

Figure 8:
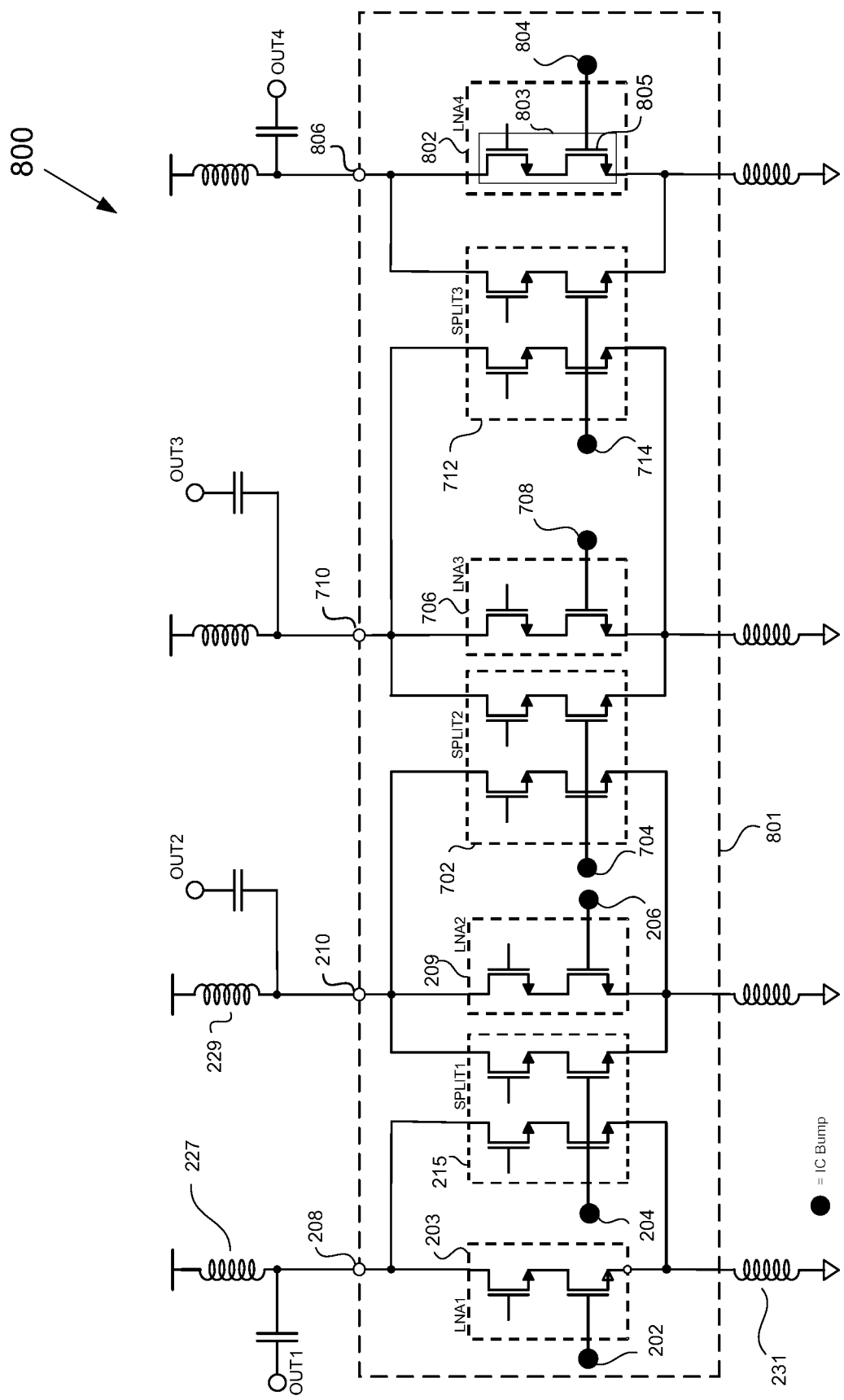
FIG. 8 is a simplified schematic of an LNA circuit in accordance with another embodiment in which a fourth signal output is provided and a fourth single LNA is provided.

FIG. 8 is a simplified schematic of an LNA circuit 800 in accordance with yet another embodiment in which a fourth signal output 806 is provided and a fourth single LNA, LNA4 802 is provided. A seventh circuit input 804 is also provided and coupled to the gate of an input FET 805 of a CAS 803 within LNA4 802. The signal output 806 from LNA4 802 is coupled to the second signal output of split-3 LNA 712. The degeneration output of LNA4 is coupled to the second degeneration output of split-3 LNA 712. Accordingly, two Intra-B CA signals, each of a different frequency band, can be received concurrently. The first can be coupled to the input of the split-1 LNA 215 and the second to the input of the split-3 LNA 712. The two aggregated signals of the first Intra-CA signal would be output through the first and second circuit outputs 208, 210. The two aggregated signals of the second Intra-B CA signal would be output through the third and fourth circuit outputs 710, 806. Alternatively, an Inter-B CA signal in which four signals have been aggregated could be applied to the inputs of each of the four single LNAs, LNA1 203, LNA2 209, LNA3 706 and LNA4 802. Each of the four aggregated signals would be output from a respective one of the four circuit outputs 208, 210, 710, 806. Other combinations of Intra-B CA signals and Inter-B CA signals may also be received. Furthermore, the basic concept shown here can be extended to include as many outputs as desired.

In addition to advantages listed above, the embodiments shown in FIGS. 7 and 8 increase the number of different bands that can be supported by a single LNAIC. With ever-increasing complexity in modern radio devices, expansion of the core concept to a large number of bands is clearly of value for certain system requirements. It will be obvious to person of ordinary skill that further expansion of the concept to more bands is envisioned by the current descriptions of the current exemplary embodiments.

A number of embodiments have been described. It is to be understood that various modifications may be made without departing from the spirit and scope of the claimed invention. For example, some of the steps described above may be order independent, and thus can be performed in an order different from that described. Further, some of the steps described above may be optional. Various activities described with respect to the methods identified above can be executed in repetitive, serial, or parallel fashion. Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

Various embodiments can be implemented to meet a wide variety of specifications. Unless otherwise noted above, selection of suitable component values is a matter of design choice. Various embodiments of the disclosed method and apparatus may be implemented in any suitable IC technology (including but not limited to FET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS) bipolar, GaAs HBT, GaN HEMT, GaAs pHEMT, and MESFET technologies.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed:

1. A method for selectively amplifying a plurality of input signals in a low noise amplifier (LNA) circuit, including:
    (a) receiving a first input signal at an input of a first LNA and selectively providing an amplified first output signal to a first circuit output;
    (b) receiving a second input signal at an input of a second LNA and selectively providing an amplified second output signal to a second circuit output; and
    (c) receiving a third input signal in a split LNA and selectively providing an amplified third output signal to the first circuit output and/or an amplified fourth output signal to the second circuit output.

2. The method of claim 1, further including:
    (a) in a first mode, setting the first LNA to an ON state, and the second LNA and the split LNA to an OFF state;
    (b) in a second mode, setting the second LNA to an ON state, and the first LNA and the split LNA to an OFF state;
    (c) in a third mode, setting the first LNA to an ON state, the second LNA to an ON state, and the split LNA to an OFF state; and
    (d) in a fourth mode, setting the split LNA to an ON state, and the first LNA and the second LNA to an OFF state.

3. The method of claim 1, further including coupling at least one input matching element to the input of a respective one of the first LNA, the second LNA, and/or the split LNA.

4. The method of claim 1, further including coupling at least one output load matching element to a respective one of the first circuit output and/or the second circuit output.

5. The method of claim 1, further including coupling at least one shunt switch between a known potential and the input of a respective one of the first LNA, the second LNA, and/or the split LNA.

6. The method of claim 1, further including filtering at least one of the first input signal, the second input signal, and/or the third input signal to match a respective amplifier characteristic of the respective first LNA, second LNA, and/or split LNA.

7. The method of claim 1, further including configuring at least one of the first LNA and the second LNA to include a cascode amplifier stage.

8. The method of claim 1, further including:
(a) configuring the split LNA to including a first cascode amplifier stage and a second cascode amplifier stage, each cascode amplifier stage having an input configured to receive the third input signal;
(b) configuring the first cascode amplifier stage to selectively provide the amplified third output signal to the first circuit output; and
(c) configuring the second cascode amplifier stage to selectively provide the amplified fourth output signal to the second circuit output.

9. The method of claim 8, further including coupling a first degeneration element to respective degeneration ports of the first LNA and the first cascode amplifier stage of the split LNA, and a second degeneration element coupled to respective ports outputs of the second LNA and the second cascode amplifier stage of the split LNA.

10. The method of claim 8, further including configuring the first cascode amplifier stage to include at least one input transistor series coupled to at least one output transistor at a first node, and configuring the second cascode amplifier stage to include at least one input transistor series coupled to at least one output transistor at a second node.

11. The method of claim 8, further including:
(a) configuring the first cascode amplifier stage to include at least one input transistor series coupled to at least one output transistor at a first node;
(b) configuring the second cascode amplifier stage to include at least one input transistor series coupled to at least one output transistor at a second node; and
(c) coupling a component between the first node of the first cascode amplifier stage and the second node of the second cascode amplifier stage, wherein the component comprises at least one of a capacitor, a resistor, a capacitor and resistor coupled in series, or a capacitor and resistor coupled in parallel.

12. A method for selectively amplifying a plurality of input signals in a low noise amplifier (LNA) circuit, including:
(a) receiving a first input signal at an input of a first LNA and selectively providing an amplified first output signal to a first circuit output;
(b) receiving a second input signal at an input of a second LNA and selectively providing an amplified second output signal to a second circuit output; and
(c) receiving a third input signal in a split LNA and selectively providing an amplified third output signal to the first circuit output and/or an amplified fourth output signal to the second circuit output;
(d) configuring the split LNA to including a first cascode amplifier stage and a second cascode amplifier stage, each cascode amplifier stage having an input configured to receive the third input signal;
(e) configuring the first cascode amplifier stage to selectively provide an amplified third output signal to the first circuit output; and
(f) configuring the second cascode amplifier stage to selectively provide an amplified fourth output signal to the second circuit output.

13. The method of claim 12, wherein:
(a) in a first mode, setting the first LNA to an ON state, and the second LNA and the split LNA to an OFF state;
(b) in a second mode, setting the second LNA to an ON state, and the first LNA and the split LNA to an OFF state;
(c) in a third mode, setting the first LNA to an ON state, the second LNA to an ON state, and the split LNA to an OFF state; and
(d) in a fourth mode, setting the split LNA to an ON state, and the first LNA and the second LNA to an OFF state.

14. The method of claim 12, further including coupling at least one input matching element to the input of a respective one of the first LNA, the second LNA, and/or the split LNA.

15. The method of claim 12, further including coupling at least one output load matching element to a respective one of the first circuit output and/or the second circuit output.

16. The method of claim 12, further including coupling at least one shunt switch between a known potential and the input of a respective one of the first LNA, the second LNA, and/or the split LNA.

17. The method of claim 12, further including filtering at least one of the first input signal, the second input signal, and/or the third input signal to match a respective amplifier characteristic of the respective first LNA, second LNA, and/or split LNA.

18. The method of claim 12, further including configuring at least one of the first LNA and the second LNA to include a cascode amplifier stage.

19. The method of claim 12, further including coupling a first degeneration element to respective degeneration ports of the first LNA and the first cascode amplifier stage of the split LNA, and a second degeneration element coupled to respective ports outputs of the second LNA and the second cascode amplifier stage of the split LNA.

20. The method of claim 12, further including configuring the first cascode amplifier stage to include at least one input transistor series coupled to at least one output transistor at a first node, and configuring the second cascode amplifier stage to include at least one input transistor series coupled to at least one output transistor at a second node.

21. The method of claim 20, further including:
(a) configuring the first cascode amplifier stage to include at least one input transistor series coupled to at least one output transistor at a first node;
(b) configuring the second cascode amplifier stage to include at least one input transistor series coupled to at least one output transistor at a second node; and
(c) coupling a component between the first node of the first cascode amplifier stage and the second node of the second cascode amplifier stage, wherein the component comprises at least one of a capacitor, a resistor, a capacitor and resistor coupled in series, or a capacitor and resistor coupled in parallel.

22. The method of claim 12, further including:
(a) configuring the first LNA to include a cascode amplifier stage including at least one input transistor series coupled to at least one output transistor at a first node;
(b) configuring the second LNA to include a cascode amplifier stage including at least one input transistor series coupled to at least one output transistor at a second node;
(c) configuring the first cascode amplifier stage of the split LNA to include an input transistor series coupled to at least one output transistor at a third node;
(d) configuring the second cascode amplifier stage of the split LNA to include an input transistor series coupled to at least one output transistor at a fourth node;
(e) selectively coupling the first node and the third node;
(f) selectively coupling the second node and the fourth node;
(g) selectively coupling the amplified third output signal from the first cascode amplifier stage of the split LNA to the first circuit output; and
(h) a selectively coupling the amplified fourth output signal from the second cascode amplifier stage of the split LNA to the second circuit output.

\* \* \* \* \*